(12) United States Patent
Muza

(10) Patent No.: US 6,255,909 B1
(45) Date of Patent: Jul. 3, 2001

(54) ULTRA LOW VOLTAGE CMOS CLASS AB POWER AMPLIFIER WITH PARASITIC CAPACITANCE INTERNAL COMPENSATION

(75) Inventor: John M. Muza, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/705,465

(22) Filed: Nov. 3, 2000

(51) Int. Cl.⁷ .................................................. H03F 3/18
(52) U.S. Cl. ................................ 330/264; 330/292
(58) Field of Search .................................. 330/255, 264, 330/267, 268, 292

(56) References Cited

U.S. PATENT DOCUMENTS

| | | | |
|---|---|---|---|
| 4,959,623 | * 9/1990 | Khoury | 330/265 |
| 4,963,837 | * 10/1990 | Dedic | 330/264 |
| 5,162,753 | * 11/1992 | Khorramabadi | 330/264 |
| 5,936,468 | * 8/1999 | Wiese et al. | 330/255 |

OTHER PUBLICATIONS

Patent Application No. 09/491,543, filed Jan. 26, 2000, Docket No. TI–28148, "A Distortion Correction Loop For Amplifier Circuits" (John Muza).

* cited by examiner

Primary Examiner—Robert Pascal
Assistant Examiner—Henry Choe
(74) Attorney, Agent, or Firm—Dwight N. Holmbo; Wade James Brady, III; Frederick J. Telecky, Jr.

(57) ABSTRACT

An ultra low voltage CMOS, class AB power amplifier has internal compensation using only parasitic gate capacitance.

25 Claims, 4 Drawing Sheets

ULTRA LOW VOLTAGE CMOS CLASS AB POWER AMPLIFIER WITH PARASITIC CAPACITANCE INTERNAL COMPENSATION

BACKGROUND OF THE INVENTION

1. Field of the Invention

This invention relates generally to power amplifier circuits, and more particularly to an ultra low voltage CMOS, class AB power amplifier that uses inherent parasitic capacitance to accomplish internal compensation.

2. Description of the Prior Art

Numerous techniques are known for achieving class AB amplifiers with quiescent current control. These conventional techniques generally employ an input gain stage in front of a class AB output stage, and use well-known Miller capacitance techniques to compensate for the input gain stage in order to achieve the requisite amplifier stability.

One common technique to achieve stability for a class AB output stage uses a source-follower stage in parallel with the primary output MOSFET in order to provide a feed-forward zero and thereby assist the desired stability (compensation). Due to circuit complexity and component matching characteristics, these designs are not optimal.

In CMOS power amplifiers, the input gate capacitance, $C_{gs}$, has been problematic due to its relatively large value (caused by its very large output device gate area). As requirements for driving lower and lower speaker impedance ($32\Omega \rightarrow 4$), and a reduced power supply environment ($2.7V \rightarrow 1.5V$), makes the output power FETs grow larger and larger, their parasitic capacitance, $C_{gs}$, continues to grow. Recent developments in CMOS technology continue to grow this trend.

In view of the foregoing, a need exists for a CMOS power amplifier that has high drive capability in combination with lower quiescent current drain and more efficient use of available supply voltage than currently available using conventional CMOS class AB power amplifiers.

SUMMARY OF THE INVENTION

To meet the above and other objectives, the present invention provides an ultra low voltage CMOS class AB power amplifier architecture that uniquely uses the gate-source parasitic capacitance, $C_{gs}$, of the primary output FETs as the main compensation capacitor. Since the CMOS class AB power amplifier output stage uses the output FET parasitic capacitance, $C_{gs}$, as the main compensation capacitor, the amplifier very closely approximates a one pole system due to the inherent lack of a dominant parasitic capacitance, and the electrical properties of the load.

The class AB power amplifier can optionally include a quiescent current control circuit to reduce the quiescent current required, for example, in low distortion amplifiers. Any pole added to the system by the quiescent current control circuit must be kept quite small in relation to the power amplifier bandwidth. The present class AB amplifier output stage further provides high drive capability from low quiescent current while simultaneously achieving efficient utilization of available supply voltage.

According to one embodiment, a class AB power amplifier output stage employs CMOS output transistors having sufficiently large parasitic gate-source capacitance, $C_{gs}$, such that the parasitic capacitance, $C_{gs}$, can be used as a compensation capacitor to achieve power amplifier stability, especially in applications where the load impedance is sufficiently small.

According to another embodiment, a class AB power amplifier comprises: an input gain stage; and a PMOS output transistor having its source connected to a first supply voltage Vdd and having its gate driven by a PMOS driver transistor in response to a positive input signal generated via the input gain stage and further having a NMOS output transistor having its source connected to a second supply voltage Vss and further having its gate driven by a NMOS driver transistor in response to a negative input signal generated via the input gain stage, wherein the output transistors and the driver transistors are configured as a class AB output stage, and further wherein the PMOS output transistor and the NMOS output transistor are selected to have substantially identical and predetermined gate-source parasitic capacitance values, such that the gate-source parasitic capacitance of the PMOS output transistor and the gate-source parasitic capacitance of the NMOS output transistor combine to achieve a class AB power amplifier having a single dominant pole.

According to yet another embodiment, a power amplifier comprises: an input gain stage; and a class AB output stage having a pair of FET output power transistors, wherein each output power transistor is configured to have a sufficiently large current carrying capacity such that gate-source parasitic capacitance associated with the output power transistors can combine to achieve a desired level of internal gain compensation in response to a high frequency modulating signal generated via the input gain stage, and further wherein the power amplifier is devoid of Miller compensation.

According to still another embodiment, an amplifier circuit comprises: an input gain stage; and a class AB output stage devoid of Miller compensation and having a first output transistor and a second output transistor, wherein each output transistor has a transconductance parasitic capacitance configured to be responsive to positive and negative signals generated by the input gain stage such that the transconductance parasitic capacitances of the output transistors combine to achieve a desired unity gain frequency for the amplifier circuit.

In one aspect of the invention, a CMOS class AB amplifier output stage uses the parasitic gate-source capacitance, $C_{gs}$, of the output transistors to achieve very high stability.

In another aspect of the invention, a CMOS class AB amplifier output stage use the parasitic gate-source capacitance, $C_{gs}$, of the output transistors to achieve high drive capability in combination with lower quiescent current drain and more efficient use of available supply voltage than currently available using conventional class AB line driver output stages.

In yet another aspect of the invention, a CMOS class AB power amplifier output stage uses the parasitic gate-source capacitance, $C_{gs}$, of the output transistors to reduce the physical size of the amplifier.

In still another aspect of the invention, a CMOS class AB power amplifier architecture is implemented to substantially eliminate unwanted effects of parasitic capacitance associated with the output transistors.

BRIEF DESCRIPTION OF THE DRAWINGS

Other aspects and features of the present invention, and many of the attendant advantages of the present invention, will be readily appreciated as the same become better understood by reference to the following detailed description, when considered in connection with the accompanying drawings, in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
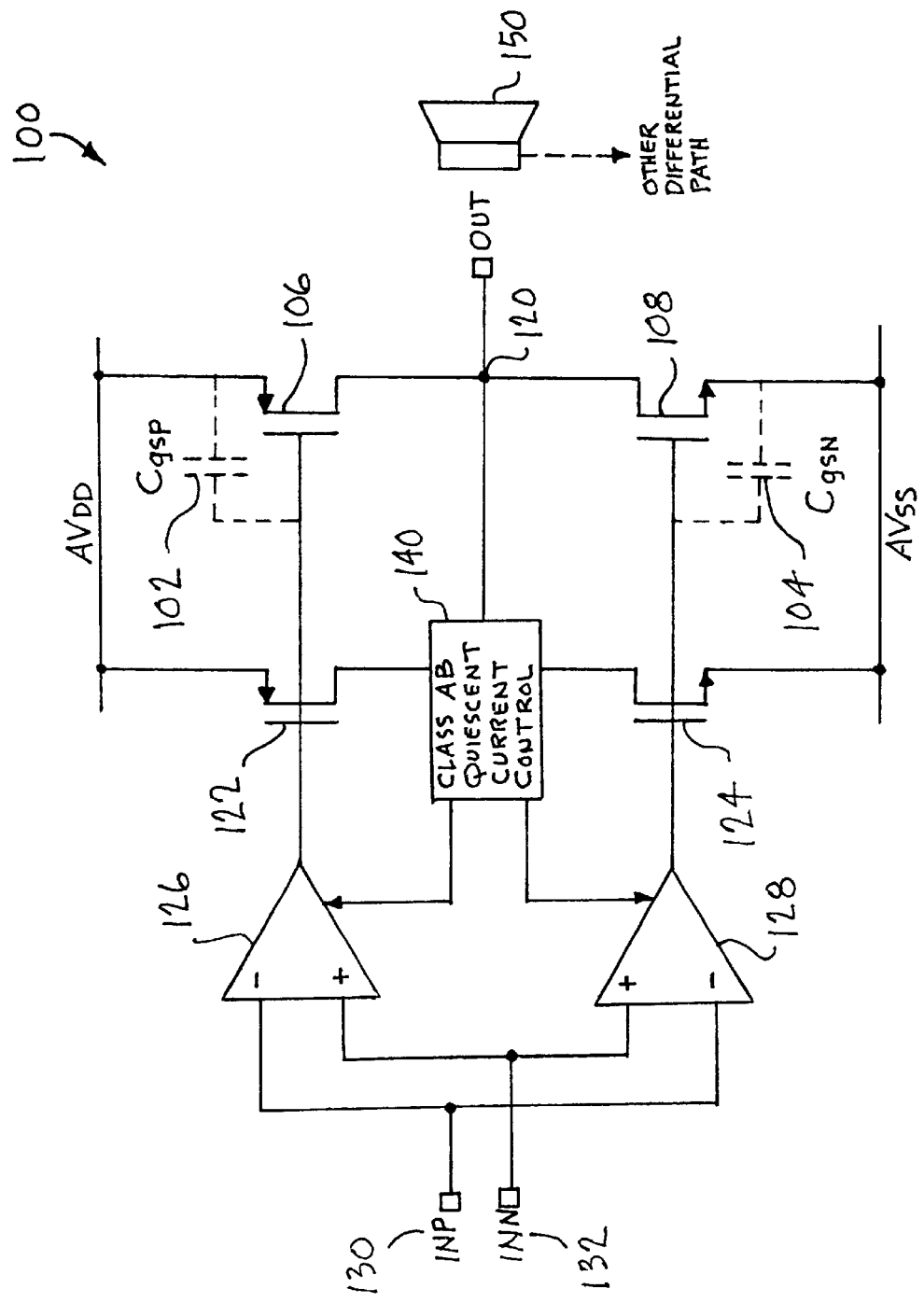
FIG. 1 is a schematic diagram illustrating an ultra low voltage CMOS, class AB power amplifier using the parasitic gate-source capacitance, $C_{gs}$, of the output transistors for internal compensation according to one embodiment of the present invention.

FIG. 1 is a schematic diagram illustrating an ultra low voltage CMOS, class AB power amplifier 100 using the parasitic gate-source capacitance, $C_{gsp}$ 102, $C_{gsn}$ 104 of the output transistors 106, 108 for internal compensation according to one embodiment of the present invention. The power amplifier 100 is a two stage system having an input gain stage and an output stage that includes the output transistors 106, 108. The present inventor realized that large CMOS power FETs could be employed in certain load current intensive applications in a way that allows the parasitic gate-source capacitance of the power FETs to eliminate the necessity for conventional pole splitting such as done with Miller compensation. When the output loading impedance, for example, is so small that the output pole is wideband, pole splitting is not necessary. Large output loading, of course, necessarily requires large power FETs to accommodate the requisite current carrying capacity. As these power FETs become larger, their associated gate-source parasitic capacitance also becomes larger, and at some point can be used as the dominant pole in the system. It can be appreciated that the power amplifier 100 will be more useful in some applications than others. One useful application for power amplifier 100 includes driving a loudspeaker 150 having an input impedance of less than 32 Ohms. Some applications, for example, can require additional compensation capacitance, such as provided by a small poly-poly capacitor in parallel with each parasitic gate-source capacitance, $C_{gsp}$, 102, $C_{gsn}$ 104 to achieve added stability. These applications are generally associated with smaller load currents. Since at least a portion of the parasitic gate-source capacitance, $C_{gsp}$, 102, $C_{gsn}$ 104 is being used as the compensation capacitor to achieve amplifier stability, the requisite area required to fabricate the power amplifier 100 will still be smaller than a similar power amplifier that does not take advantage of the output transistor parasitic capacitance to achieve increased amplifier stability.

Looking again at FIG. 1, the class AB power amplifier 100 can be seen to have an upper (source) PMOS output transistor 106 having its source connected to a supply voltage $AV_{DD}$ and a lower (sink) NMOS transistor 108 having its source connected to a apply voltage $AV_{SS}$. The drains of both output transistors 106, 108 are connected together at a common output node 120. The gate of PMOS output transistor 106 is connected to the gate of a PMOS quiescent current control transistor 122 that also has its source connected to the supply voltage $AV_{DD}$. The gate of NMOS output transistor 108 is connected to the gate of a NMOS quiescent current control transistor 124 that also has its source connected to the supply (ground) voltage $AV_{SS}$. The gate of each quiescent current control transistor 122, 124 is fed by a respective difference amplifier 126, 128 that receives positive and negative input signals 130, 132. The drain of each quiescent current control transistor 122, 124 is connected to a common class AB quiescent current control element 140 that is also connected to the output node 120 and that provides feedback to each difference amplifier 126, 128 that forms a portion of the input gain stage. Each quiescent current control transistor 122, 124 operates in response to a scaled copy of the output current flowing in the output transistors 106, 108 respectively to implement a current control loop.

The class AB quiescent current control element 120 is not unique to the present invention, and therefore will not be discussed herein, except to state that any such quiescent current control element will add at least another pole to the system 100. Any such pole must be kept quite small in relation to the main amplifier 100 bandwidth, which contributes to a relatively slow settling of the output transistor 106, 108 bias currents. This settling time, however, is generally small when compared with other time constants in the system 100, and is therefore of no immediate concern in specific applications (e.g., DAC channel).

With continued reference now to FIG. 1, the power amplifier 100 architecture is particularly useful in eliminating and/or minimizing adverse effects caused by large parasitic capacitance 102, 104 associated with the output transistors 106, 108. Conventional techniques, discussed herein before, used for addressing these adverse effects result in increased current consumption, therefore making these conventional techniques undesirable and often not useful. The present inventor importantly realized that increasing the size of the output transistors 106, 108 to achieve a desired value of parasitic capacitance 102, 104 and/or to accommodate a specific application that requires substantial current carrying capacity, would allow transformation of the parasitic capacitance 102, 104, into a compensation capacitor without the necessity to add a more conventional Miller capacitor. Using the output transistor parasitic capacitance 102, 104 as a compensation capacitor to achieve amplifier stability, therefore, effectively eliminates the effects normally associated with such parasitic capacitance by transforming this parasitic capacitance into a compensation capacitor to limit or control the unity gain bandwidth of the power amplifier 100. The use of output transistor parasitic capacitance 102, 104 as a compensation capacitor was found by the present inventor to provide acceptable total harmonic distortion (THD). Further, the amplifier 100 architecture provides advantages over known amplifier architectures that use Miller compensation, since it can operate at very low voltages (power supply) associated with advanced CMOS processes and consumes less power.

In summary explanation, a CMOS class AB power amplifier takes the very large output transistor gate-source parasitic capacitance, $C_{gs}$, and transforms it into a useful compensation capacitor. This technique creates a very clean and very stable power amplifier design that can operate at very low power supply voltages (e.g., 1.5V), gives the power amplifier output MOS transistors good gate drive capability (due to smaller area requirements), and offers comparable linearity to other known two-stage power amplifier architectures. One system using the power amplifier 100 was found to achieve a THD of about 96 dB into a 4-Ohm load at 1 kHz, using a 1.8 volt supply, while consuming only 700 $\mu$A.

Figure 2:
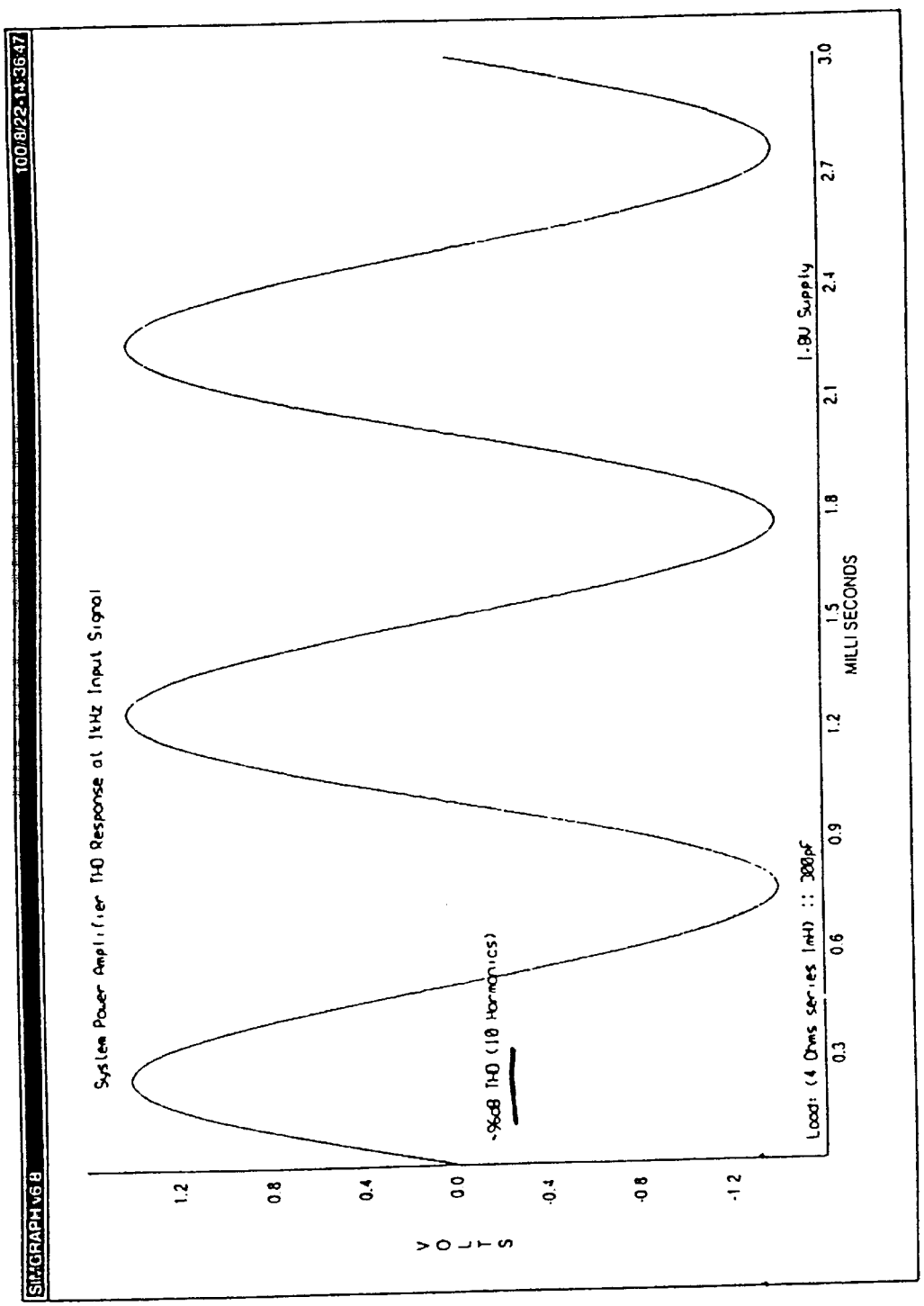
FIG. 2 is a graph illustrating a simulated THD response to a 1 KHz input signal for the class AB power amplifier depicted in FIG. 1.

FIG. 2 is a graph illustrating a simulated THD response to a 1 KHz input signal for one system using the class AB power amplifier 100 depicted in FIG. 1. The THD is about 96 dB while using only about 700 $\mu$A of current for the amplifier 100.

Figure 3:
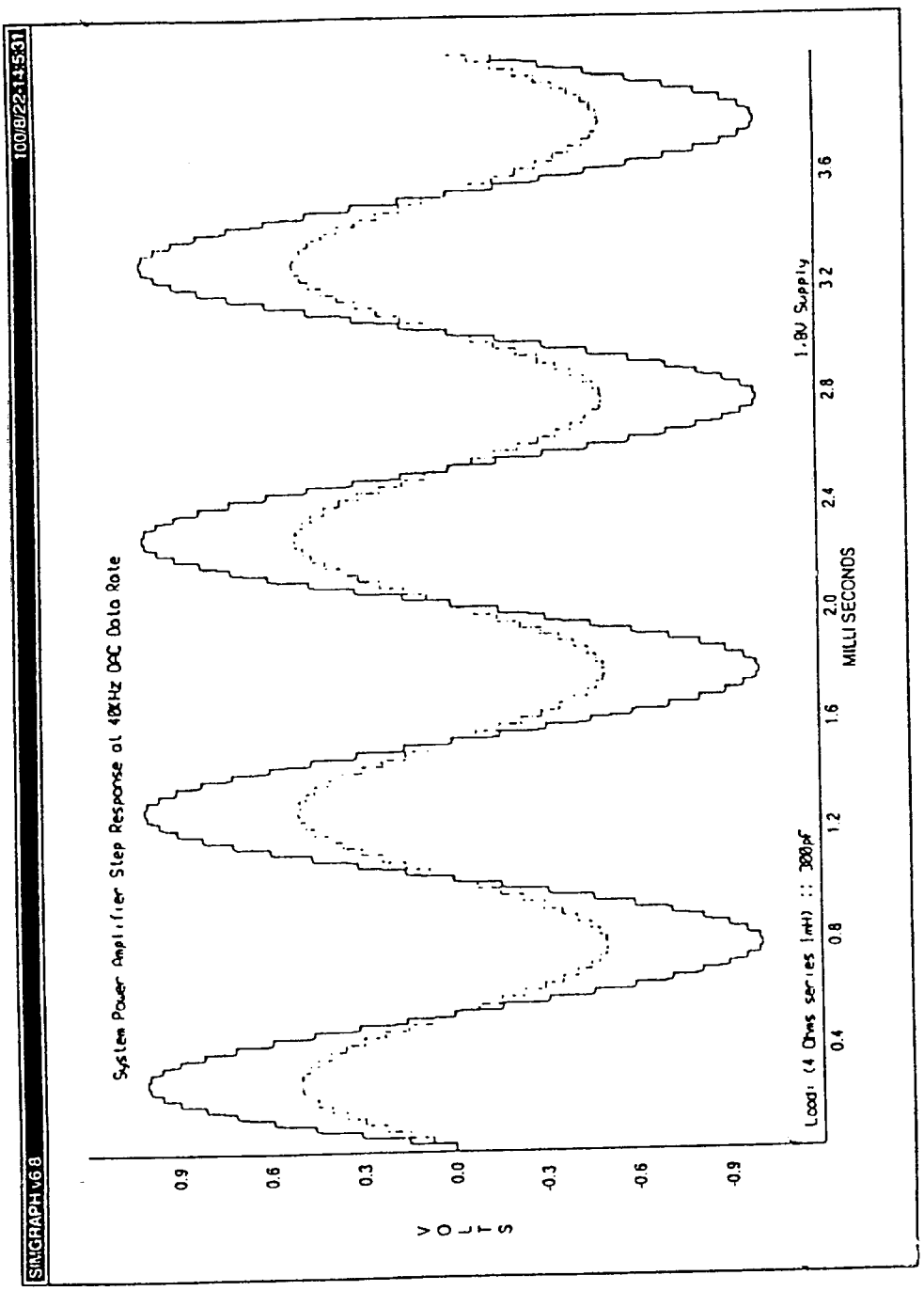
FIG. 3 is a graph illustrating simulated step response characteristics at a 40 KHz DAC data rate for the class AB power amplifier depicted in FIG. 1.

FIG. 3 is a graph illustrating simulated step response characteristics at a 40 KHz DAC data rate for one system using the class AB power amplifier 100 depicted in FIG. 1. The step response is shown over the entire expected output signal swing range, in which clean settling is demonstrated.

Figure 4:
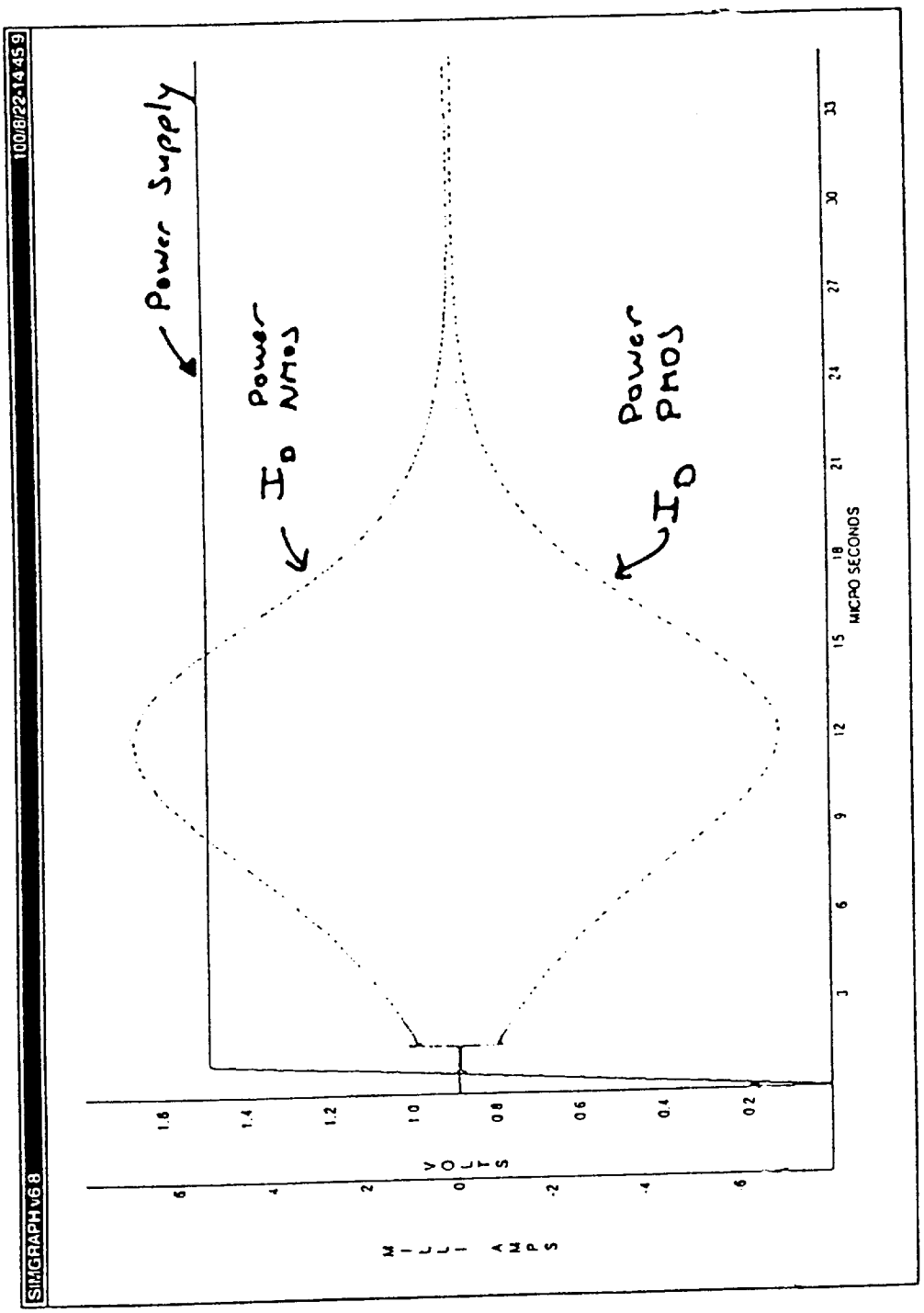
FIG. 4 is a graph illustrating simulated output transistor quiescent current settling characteristics during power-up for the class AB power amplifier depicted in FIG. 1.

FIG. 4 is a graph illustrating simulated output transistor 106, 108 quiescent current settling characteristics during power-up for a system using the class AB power amplifier 100 depicted in FIG. 1. Good quiescent current settling can be seen to be achieved using less than 1.8 volts (power supply).

In view of the above, it can be seen the present invention presents a significant advancement in the art of class AB amplifier output stage circuit technology. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular transistor types, the present inventive structures and characteristics are not necessarily limited to particular transistor types or sets of characteristics as used herein. It shall be understood the embodiments described herein above can easily be implemented using many diverse transistor types so long as the combinations achieve a low distortion class AB amplifier output stage according to the inventive principles set forth herein above.

What is claimed is:

1. A class AB power amplifier comprising:
    an input gain stage; and
    a PMOS output transistor having its source connected to a first supply voltage Vdd and having its gate driven by a PMOS driver transistor in response to a positive input signal generated via the input gain stage and further having a NMOS output transistor having its source connected to a second supply voltage Vss and further having its gate driven by a NMOS driver transistor in response to a negative input signal generated via the input gain stage, wherein the output transistors and the driver transistors are configured as a class AB output stage, and further wherein the PMOS output transistor and the NMOS output transistor are selected to have predetermined gate-source parasitic capacitance values, such that the gate-source parasitic capacitance of the PMOS output transistor and the gate-source parasitic capacitance of the NMOS output transistor combine to achieve a class AB power amplifier having a single dominant pole.

2. The class AB power amplifier according to claim 1 wherein the input gain stage and the output stage are devoid of Miller compensation.

3. The class AB power amplifier according to claim 2 further comprising means for controlling quiescent bias current associated with the output transistors.

4. The class AB power amplifier according to claim 1 wherein the first supply voltage Vdd is about 1.5 volts.

5. The class AB power amplifier according to claim 1 wherein the second supply voltage Vss is about zero volts.

6. The class AB power amplifier according to claim 1 wherein the output stage is operational to drive a load impedance less than 32 Ohms.

7. A power amplifier comprising:
    an input gain stage; and
    a class AB output stage having a pair of FET output power transistors, wherein each output power transistor is configured to have a sufficiently large current carrying capacity such that gate-source parasitic capacitances associated with the output power transistors can combine to achieve a desired level of internal gain compensation in response to a high frequency modulating signal generated via the input gain stage, and further wherein the power amplifier is devoid of Miller compensation.

8. The power amplifier according to claim 7 further comprising means for controlling quiescent bias current associated with the FET output power transistors.

9. The power amplifier according to claim 7 wherein the gate-source parasitic capacitance associated with the output power transistors is combined to establish a unity gain frequency for the power amplifier.

10. The power amplifier according to claim 7 wherein the gate-source parasitic capacitance associated with the output power transistors combine to establish a dominant pole for the power amplifier.

11. The power amplifier according to claim 7 wherein the gate-source parasitic capacitance associated with each output power transistor has a capacitance value such that each parasitic capacitance can be transformed into a compensation capacitance sufficient to cause all other parasitic capacitances associated with the power amplifier to be associated solely with wideband poles such that a single dominant pole can be established via the transformed capacitance without the necessity to add Miller compensation.

12. The power amplifier according to claim 7 wherein the input stage and the output stage are capable of operating from a supply voltage of about 1.5 volts.

13. An amplifier circuit comprising:
    an input gain; stage; and
    a class AB output stage devoid of Miller compensation and having a first output transistor and a second output transistor, wherein each output transistor has a transformed parasitic capacitance configured to be responsive to positive and negative signals generated by the input gain stage such that the transformed parasitic capacitances of the output transistors combine to achieve a desired unity gain frequency for the amplifier circuit.

14. The amplifier circuit according to claim 13 further comprising means for controlling quiescent bias current for the first and second output transistors.

15. The amplifier circuit according to claim 13 wherein the output transistors are CMOS devices.

16. The amplifier circuit according to claim 15 wherein the parasitic capacitances are gate-source capacitances.

17. The amplifier circuit according to claim 16 wherein the input gain stage and the output stage are capable of operating with a single supply voltage of about 1.5 volts.

18. The amplifier circuit according to claim 13 wherein the output transistors are bipolar devices.

19. The amplifier circuit according to claim 18 wherein the parasitic capacitances are base-emitter capacitances.

20. The amplifier circuit according to claim 13 wherein the transformed parasitic capacitances associated with the output transistors combine to establish a single dominant pole for the amplifier circuit.

21. The amplifier circuit according to claim 20 wherein the transformed parasitic capacitances are gate-source capacitances.

22. The amplifier circuit according to claim 13 wherein the transformed parasitic capacitances are operative to establish a compensation capacitance sufficient to achieve amplifier circuit stability without adding Miller compensation.

23. The amplifier circuit according to claim 22 wherein the transformed parasitic capacitances are gate-source capacitances.

24. The amplifier circuit according to claim 13 wherein the transformed parasitic capacitances are operative to cause all other parasitic capacitances associated with the amplifier circuit to become associated solely with wideband poles.

25. The amplifier circuit according to claim 24 wherein the transformed parasitic capacitances are gate-source capacitances.

* * * * *

UNITED STATES PATENT AND TRADEMARK OFFICE
CERTIFICATE OF CORRECTION

PATENT NO. : 6,255,909 B1  Page 1 of 1
DATED : July 3, 2001
INVENTOR(S) : John M. Muza It is certified that error appears in the above-identified patent and that said Letters Patent is hereby corrected as shown below:

Title page,
Filing date needs to be corrected to read "Nov. 2, 2000"

Signed and Sealed this

Twenty-ninth Day of January, 2002

Attest:

Attesting Officer

JAMES E. ROGAN
Director of the United States Patent and Trademark Office